United States Patent [19]
Mohwinkel et al.

[11] Patent Number: 5,528,203
[45] Date of Patent: Jun. 18, 1996

[54] COPLANAR WAVEGUIDE-MOUNTED FLIP CHIP

[75] Inventors: Clifford A. Mohwinkel, San Jose; Edwin F. Johnson, Sunnyvale; Edward B. Stoneham, Los Altos, all of Calif.

[73] Assignee: Endgate Corporation, Sunnyvale, Calif.

[21] Appl. No.: 478,375

[22] Filed: Jun. 7, 1995

Related U.S. Application Data

[63] Continuation of Ser. No. 313,927, Sep. 26, 1994, abandoned.

[51] Int. Cl.⁶ ........................................................ H01P 5/12
[52] U.S. Cl. ........................... 333/128; 333/247; 330/286; 330/295
[58] Field of Search .................................... 333/128, 247; 330/286, 295; 257/664, 691, 728, 791

[56] References Cited

U.S. PATENT DOCUMENTS

| | | |
|---|---|---|
| 3,517,278 | 6/1970 | Hager . |
| 3,622,385 | 11/1971 | Stork ................................. 117/217 |
| 4,135,168 | 1/1979 | Wade ................................. 331/108 R |
| 4,376,287 | 3/1983 | Sechi ................................. 330/286 X |
| 4,430,623 | 2/1984 | Bert et al. ......................... 330/286 |
| 4,511,860 | 4/1985 | Bastida et al. .................... 333/247 X |
| 4,523,163 | 6/1985 | Houdart et al. ................... 333/247 X |
| 4,617,586 | 10/1986 | Cuvilliers et al. ................. 257/664 X |
| 4,739,519 | 4/1988 | Findley ............................. 333/128 X |
| 5,087,896 | 2/1992 | Wen et al. . |
| 5,105,171 | 4/1992 | Wen et al. ......................... 333/116 |
| 5,115,245 | 5/1992 | Wen et al. . |
| 5,132,641 | 7/1992 | Khandavalli ...................... 333/128 X |
| 5,138,436 | 8/1992 | Koepf . |
| 5,194,833 | 3/1993 | Dougherty et al. ............... 333/247 X |
| 5,206,986 | 5/1993 | Arai et al. ......................... 29/840 |

OTHER PUBLICATIONS

P. Wallace, A. Wohlert & A. A. Immorlica, Jr., D. Buck, "Flip–Chip BeO Technology Applied to GaAs Active Aperture Radars", *Microwave Journal* Nov. 1982, pp. 109–113.

N. Takachio, Katsushi Iwashita, Susumu Hata, K. Katsura, K. Onodera, H. Kikuchi "A 10 Gb/s Optical Heterodyne Detection Experiment Using a 23 GHz Bandwidth Balanced Receiver", *1990 IEEE MTT–S Digest*, pp. 149–151.

John L. B. Walker, ed., *High–power GaAs FET Amplifiers*, 1993 Artech House, Inc., ISBN 0 89006 479 2, pp. 87, 90.

*Primary Examiner*—Paul Gensler
*Attorney, Agent, or Firm*—Edward B. Anderson

[57] ABSTRACT

A radio-frequency power amplifier includes a multiple-FET chip that is flip mounted on a connection region of a substrate. An input impedance-matching network is also mounted on the substrate. The network includes a coplanar waveguide having an elongate waveguide signal conductor for each gate terminal on the FET chip with a distal end spaced from the connection region and a proximal end in the connection region. The distal ends are connected to a single base input conductor. The proximal ends are flip mounted to respective ones of gate terminals of the FET chip. A capacitor couples each of the input signal conductor distal ends to an adjacent ground conductor. The signal conductors and capacitors provide a selected impedance at a selected frequency. The capacitors may be on a separate chip flip mounted to the waveguide signal and ground conductors, and may be formed as coplanar waveguides with open-ended signal conductors. An output coplanar waveguide includes, for each drain terminal, an output signal conductor having an end in the connection region that is electrically connected to the flip mounted FET chip. This waveguide also has a length selected to provide desired impedance matching and may also have other means of impedance matching.

24 Claims, 3 Drawing Sheets

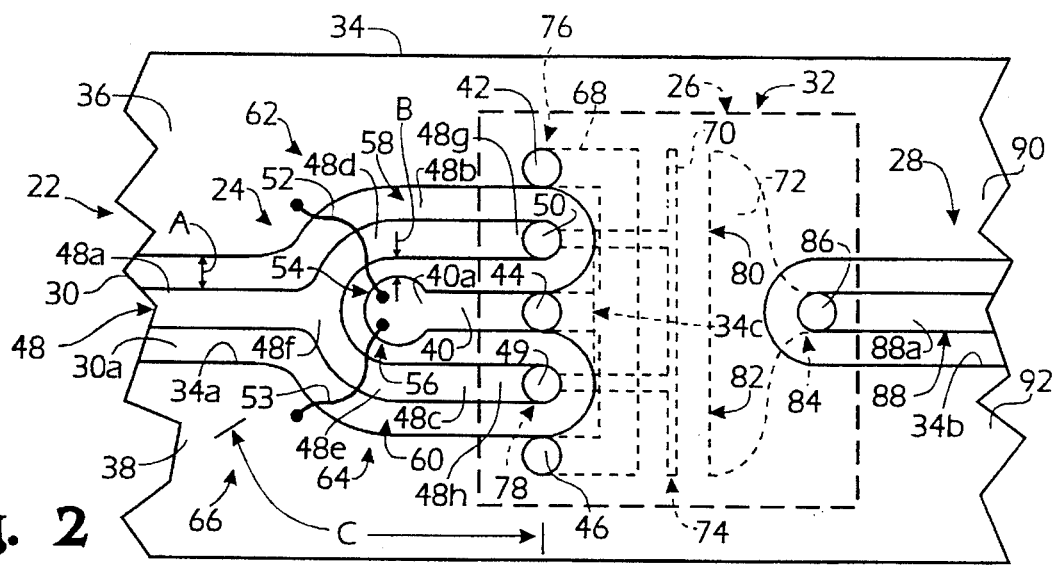

COPLANAR WAVEGUIDE-MOUNTED FLIP CHIP

This is a continuation of application Ser. No. 08/313,927, filed on Sep. 26, 1994, now abandoned.

BACKGROUND OF THE INVENTION

1. Field of the Invention

This invention relates to high frequency coplanar waveguide circuit structures, and in particular to flip mounting of circuit components on a coplanar waveguide.

2. Related Art

Mounting integrated circuit flip-chips on a motherboard has been found to be an effective way to connect radio frequency circuit components together. The use of flip mounting provides a substitute attachment method that replaces the use of bond wires, backside metalization and vias, air bridges, and dielectric crossovers on the mother substrate. The conducting columns or bumps that connect the chip to the mother board can be formed using solder, brazing material or conductive adhesives. However, the preferred method is by thermocompression bonding because of the resulting reduced impact on losses and parasitics and improved consistency.

Also, in such high frequency applications, the use of coplanar transmission lines is well established. Typical examples include conventional coplanar waveguides (ground-signal-ground lines), slot lines, balanced ground-signal-signal-ground lines, and parallel-strip balanced lines. Coplanar waveguides are particularly useful because of the simplified structure provided by having both signal and ground conductors on a single plane and the resulting access to the ground planes on both sides of the signal conductor. Adjacent coplanar waveguides are known to be used to connect different flip-mounted circuits. The coplanar waveguides also provide improved isolation between signal conductors as compared to some other transmission line structures.

The flip-chip itself typically contains one or more transistors. In a power chip, a plurality of transistors are often driven by a single control lead, such as the base or gate depending on the type of transistor involved. Correspondingly, the associated set of collectors or drains, i.e., current-carrying terminals, are joined to a single output terminal. Impedance-matching for the composite power transistor is accomplished on the mother board.

SUMMARY OF THE INVENTION

It is found, as just noted, that an effectively large power transistor can be provided by a set of smaller transistors connected in parallel. However, this basic structure requires that input and output impedance matching be provided for the entire transistor. It is desirable to take advantage of flip-chip technology to provide power amplifiers and yet to provide matching separately for the individual transistors making up an associated power transistor. In the general sense, then, it is desirable to be able to provide matching on the mother board for the individual transistors on the chip.

This is provided in the present invention by a coplanar waveguide-based circuit structure comprising an electrically insulating substrate having a planar face with a connection region, and a coplanar waveguide mounted on the substrate face. The coplanar waveguide has first and second, spaced-apart coplanar ground conductors, and a signal conductor coplanar with the ground conductors and positioned between and spaced from the first and second ground conductors. A signal conductor and at least one coplanar ground conductor extend into the connection region. An integrated circuit is flip mounted onto the connection region of the substrate with a first terminal flip mounted to the one ground conductor and a second terminal flip mounted to the signal conductor. The integrated circuit, in the general sense, can have any functional circuit on it, such as a single active or passive device, or a more complex circuit formed of various combinations of such devices.

The preferred embodiment of the invention provides a radio-frequency power amplifier in which the integrated circuit has a plurality of field-effect transistors (FETs). Each transistor has associated gate, source and drain terminals on the chip. An input impedance-matching network is mounted on the substrate. The network includes a coplanar waveguide having an elongate waveguide signal conductor for each gate terminal with a distal end spaced from the connection region and a proximal end in the connection region. The distal ends are connected to a single base input conductor. The proximal ends are flip mounted to respective ones of the gate terminals.

The network further includes a capacitor that couples each of the input signal conductor distal ends to an adjacent ground conductor. The lengths of the signal conductors and sizes of the capacitors are chosen to provide a selected impedance at a selected frequency. The capacitors may be on a separate chip flip mounted to the waveguide signal and ground conductors, in which case they are formed as coplanar waveguides with open-ended signal conductors.

An output coplanar waveguide, includes for each drain terminal, an output signal conductor having an end in the connection region that is electrically connected to the FET flip-chip. This waveguide also has a length and other dimensions selected to provide desired impedance matching.

The invention thus provides for the advantageous use of flip mounting radio frequency chips directly onto coplanar waveguides. Further, such waveguides may have a signal conductor that splits into a plurality of waveguide sections that provide distributed impedance matching. These and other features and advantages of the present invention will be apparent from the preferred embodiments described in the following detailed description and illustrated in the accompanying drawings.

BRIEF DESCRIPTION OF THE DRAWINGS

FIG. 2 is a plan view of a first preferred embodiment of the amplifier of FIG. 1 made according to the present invention.

FIG. 3 is a simplified plan view of a second embodiment of the invention that is an extension of the embodiment of FIG. 2.

FIG. 4 is a plan view similar to FIG. 3 showing a third embodiment of the invention.

DETAILED DESCRIPTION OF THE PREFERRED EMBODIMENTS

Figure 1:
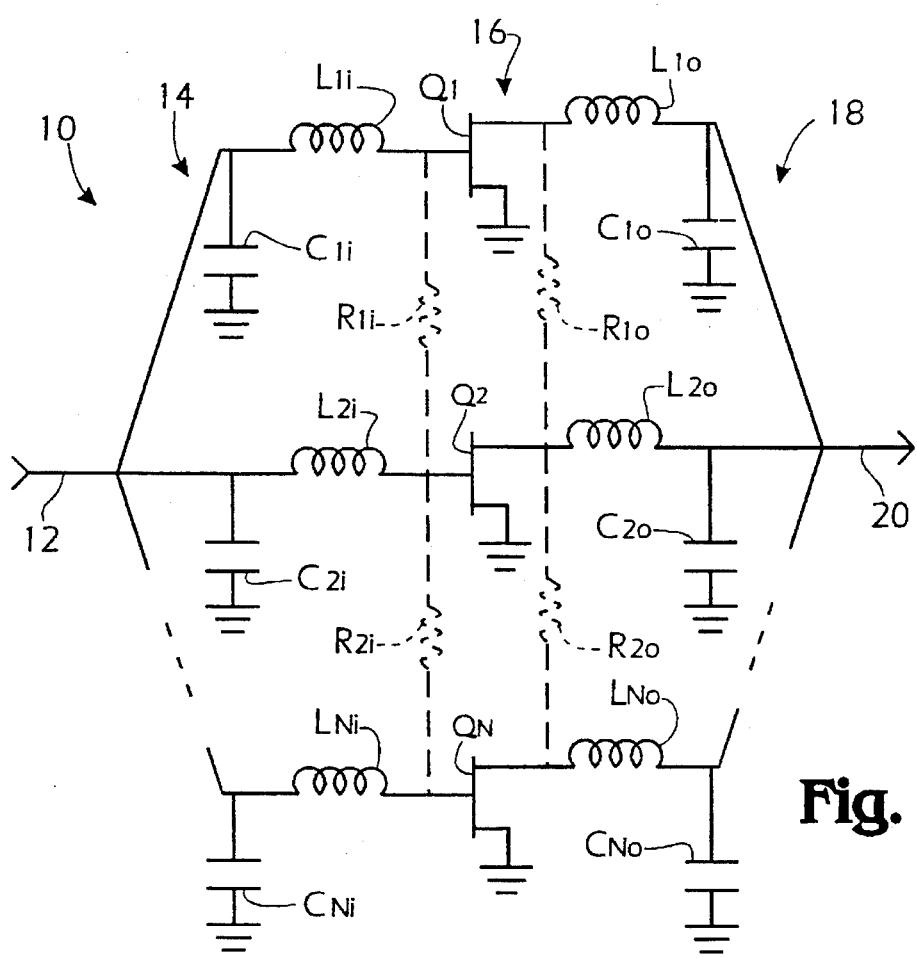
FIG. 1 is a schematic of an impedance-matched power amplifier that may be made according to the invention.

Referring initially to FIG. 1, an exemplary power amplifier 10 is shown that illustrates an electrical circuit that may be made according to the invention. Amplifier 10 includes a single input signal line 12 that is received by an input impedance-matching network 14 for matching the input impedance of a composite transistor 16 to an input circuit. Correspondingly, an output impedance-matching network 18 matches the composite transistor output impedance to an output circuit connected to a single output signal line 20.

The amplifier is comprised of N sections. The input impedance-matching circuit for each section i includes a shunt capacitance $C_{ii}$ and a series inductance $L_{ii}$, which in radio frequency applications is typically in the form of a transmission line. Isolation for odd mode oscillations may be provided by isolation resistors $R_{ii}$ in the input circuit between sections, and may be provided in the output circuit as shown by resistors $R_{io}$. Correspondingly, the output impedance-matching circuit includes, for each section i, a series inductance $L_{io}$ and a shunt capacitance $C_{io}$.

Each section i has a transistor $Q_i$. These are shown in the preferred form as FETs, although they may be bipolar transistors as well. The set of transistors $Q_i$, i=1, 2, . . . N, form, in concert composite transistor 16. As will be seen with regard to specific embodiments of the invention, the gates, sources and drains may be unbroken. That is, they may be sections of corresponding composite elements.

FIG. 2 illustrates an embodiment of an amplifier 22 made according to the invention. Amplifier 22 includes an input or first coplanar waveguide 24, a flip-mounted FET chip 26, also referred to as a circuit component, shown in dashed lines, and an output or second coplanar waveguide 28, all mounted relative to a substrate 30. The substrate includes a planar face 30a and has what is referred to as a connection region 32 defined generally by the outline of FET chip 26.

Mounted on substrate 30 is a ground plane 34 that includes first, second and third ground conductors 36, 38 and 40. Third ground conductor 40 is elongate and has an enlarged input or distal end 40a. These three ground conductors are all preferably integrally joined in the connection region as shown. Electrically conductive flip-mounting bumps 42, 44 and 46 connect the ground conductors to corresponding source terminals of FET chip 26 located in connection region 32.

Extending in a slot 34a in the ground plane is an input or first signal conductor 48 that is spaced from ground conductors 36, 38 and 40 by a generally uniform or average (per unit length of conductor 48) distance A. Ground conductor 40 may not be required, as represented by alternative ground plane edge 34c shown as a dotted line, such as when conductor 48 is closely coupled to conductors 36 and 38. The input signal conductor includes a single input base portion 48a and first and second branch portions 48b and 48c. These branch portions are connected at what are referred to as input or distal ends 48d and 48e at a junction 48f to base portion 48a. Output or proximal ends 48g and 48h are connected to gate terminals of FET chip 26 via flip-chip bumps 49 and 50. Enlarged end 40a of ground conductor 40 is connected to the adjacent sections of ground conductors 36 and 38 by suitable air bridges 52 and 53, or by equivalent structure.

The enlarged end of ground conductor 40 is seen to be spaced a distance B from distal ends 48d and 48e of the input signal conductor that is less than distance A. This reduced spacing results in increased capacitances 54 and 56 between the associated sections of the ground conductor and the branch portions of the input signal conductor. This reduced spacing could also be achieved by enlarging the signal conductor, such as a stepped or a gradual increase in size.

These capacitances correspond to capacitances $C_{1i}$ and $C_{2i}$ shown in amplifier 10 of FIG. 1. Similarly, the length C of branch portions 48b and 48c comprise transmission lines 58 and 60 that correspond to inductances $L_{1i}$ and $L_{2i}$ of amplifier 10. Capacitance/inductance combinations 54/58 and 56/60 thus form individual impedance-matching circuits 62 and 64, respectively, that together comprise a composite input impedance-matching circuit 66. Other techniques, such as placing dielectric layers over the conductors or adding backside metalization may also be used for impedance matching.

FET chip 26 may be constructed according to conventional techniques. It includes a source 68, a gate 70 and a drain 72 which form a composite FET 74. Source 68 is connected in this embodiment to flip-chip bumps 42, 44 and 46. These bumps thus form a set 76 of terminals that serve to connect source 68 to ground. Gate 70 is connected to bumps 49 and 50 on which an input signal is received from signal conductor 48. Bumps 49 and 50 accordingly may be considered a set 78 of control terminals for individual FETs 80 and 82. Drain 72 is connected to a set 84 of output current terminals, consisting in this embodiment of a single output current terminal represented by a flip-chip bump 86.

As is seen, bump 86 is connected to what may be considered the proximal end 88a of a second or output signal conductor 88. Conductor 88 is positioned in a slot 34b of the ground plane and is spaced a distance A on opposite sides from fourth and fifth ground conductors 90 and 92, which together form output coplanar waveguide 28. Although not shown as being the same, impedance matching may be provided on the output using the techniques described with reference to the input.

FIG. 3 illustrates, in simplified form an amplifier 100 that is similar to amplifier 22. Amplifier 100 includes an input coplanar waveguide 102 that has four terminations 104, 106, 108, and 110 in a connection region 112 associated with a transistor chip 114. Waveguide 102 is in the form of a binary division with a first junction 116a dividing a signal conductor 116 into initial branch portions 116b and 116c. Each of branch portions 116b and 116c then divides into respective branch portions 116d, 116e, 116f and 116g.

Similarly, an output coplanar waveguide 118 has an output signal conductor 120 that joins at a junction 120a from two branch portions 120b and 120c into a single output base portion 120d. Branch portions 120b and 120c are joined to chip 114 at terminals 122 and 124.

FIG. 4 illustrates an amplifier 130 that is similar to FIG. 3 except for the shape of an input coplanar waveguide 132. This waveguide has an input signal conductor 134 that divides directly into four parallel branch portions 134a, 134b, 134c and 134d from oppositely directed junction arms 134e and 134f extending from a base portion 134g.

As is apparent other junction configurations are possible for a coplanar waveguide having a split signal path. Also, the splits into multiple branch portions may be made non-symmetrical in order to divide the power unequally.

Figure 6:
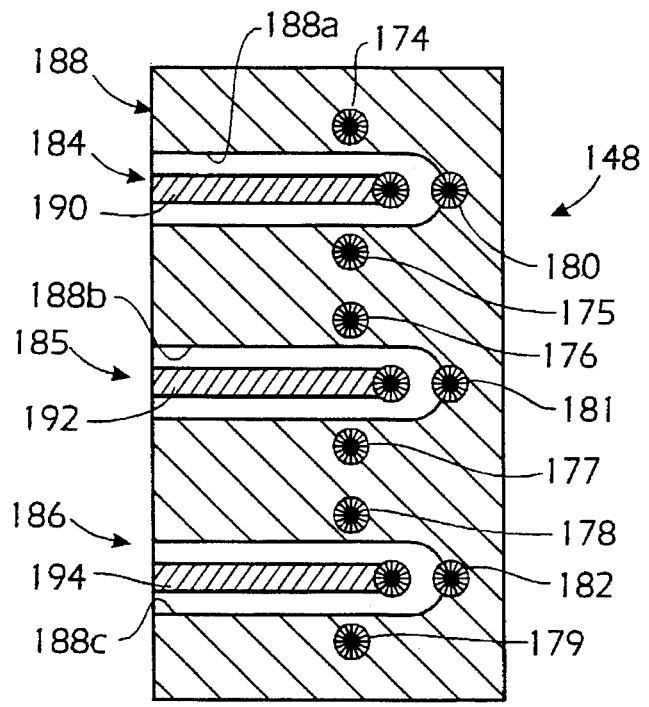
FIG. 6 is a scale cross-section view of a capacitor flip-chip used in the embodiment of FIG. 5.
Figure 5:
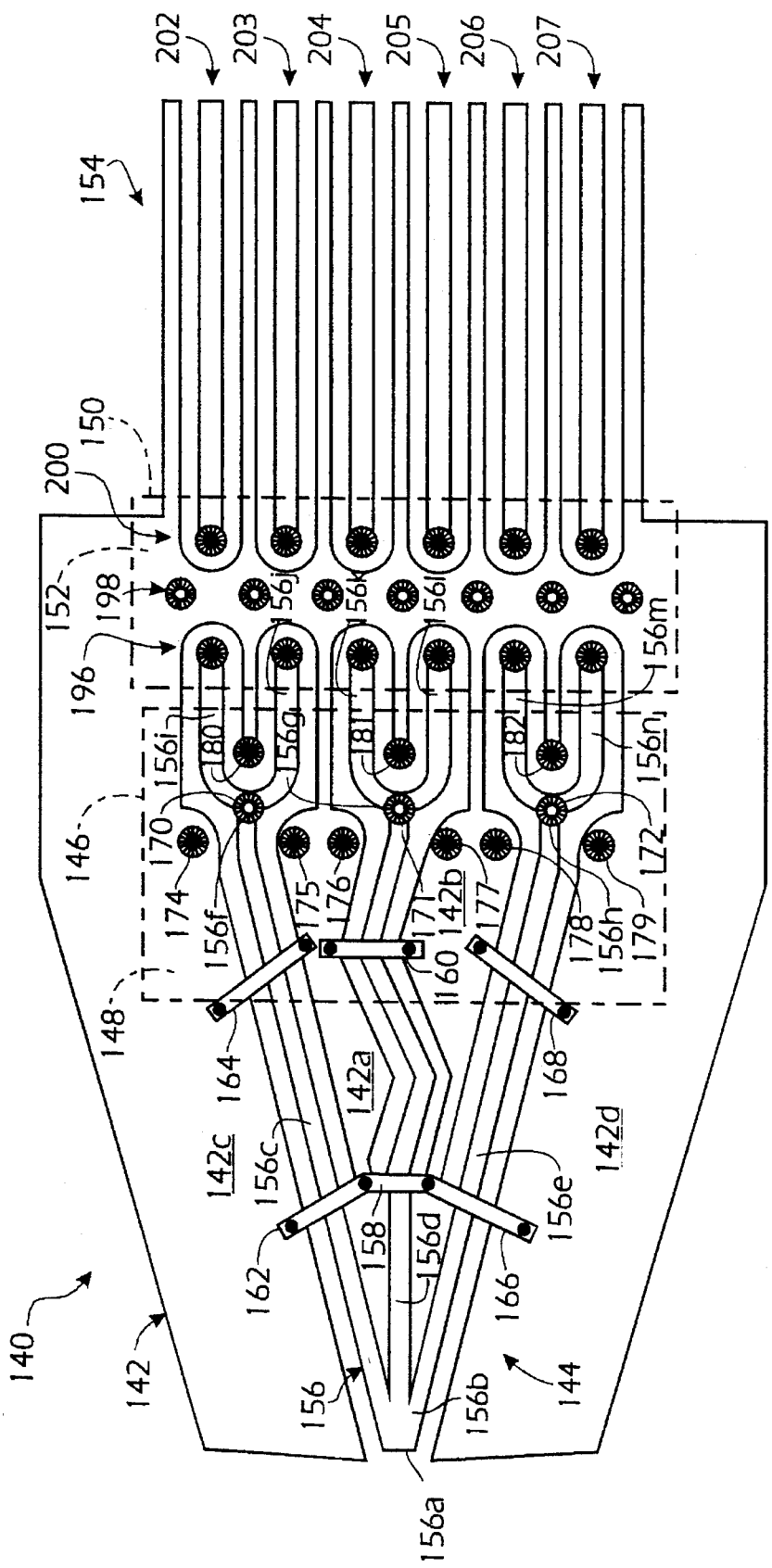
FIG. 5 is a scale plan view of yet a fourth embodiment of the invention.

FIGS. 5 and 6 are plan views of a preferred design of an amplifier 140 that is yet another embodiment of the invention. For simplicity the substrate on which the coplanar waveguides are mounted is not shown. Amplifier 140 includes an integral ground plane 142 that forms a multiple-split-path input coplanar waveguide 144 that extends through a first flip-chip connection region 146. Region 146 is for connecting a capacitor chip 148. Waveguide 144 terminates in a second flip-chip connection region 150 in which it is connected to a FET chip 152. A split-path output coplanar waveguide 154 extends from region 150.

Input coplanar waveguide 144 is like the combination of three waveguides like waveguide 24 illustrated in FIG. 2. This waveguide includes an input signal conductor 156 having an initial base section 156a. This section immediately splits at a junction 156b into three primary branch portions 156c, 156d and 156e having substantially equal lengths. These branch portions then each divide at respective junctions 156f, 156g and 156h into respective parallel secondary branch portions 156i and 156j, 156k and 156l, and 156m and 156n. Each of these latter branch portions forms a transmission line Segment having inherent inductance, as has been described with regard to the embodiment of FIG. 2.

These split signal conductors divide the ground plane into intermediate portions 142a and 142b positioned between the adjacent primary branch portions 156c, 156d and 156e. Air bridges 158 and 160 connect these ground portions together at spaced locations. Similarly, air bridges 162 and 164 connect ground portion 142a with a first base ground portion 142c, and air bridges 166 and 168 connect ground portion 142b with a second base ground portion 142d. Alternatively, chip 148 could be extended over the primary branch portions with appropriate metalization and flip-connections for providing the ground crossover connections instead of the air bridges.

Flip-chip bumps 170, 171 and 172 for capacitor chip 148 are located on input signal conductor junctions 156f, 156g and 156h. Also, flip-chip bumps 174, 175, 176, 177, 178, 179, 180, 181 and 182 connect the various ground plane portions with flip-chip 148. Chip 148 is shown in a simplified top view in FIG. 6 as it would be viewed on the dash-dot footprint of the chip shown in FIG. 5 with cross-section hatching showing metalization. For simplicity, the flip-chip bumps shown in FIG. 6 are given the same numbers as shown in FIG. 5.

It is seen that chip 148 has three coplanar waveguides 184, 185 and 186. Ground plane 142 is connected through the associated bumps to a chip ground plane 188 having slots 188a, 188b and 188c that have open-ended signal conductors 190, 192 and 194. These conductors are connected at one end to bumps 170–172. Waveguides 184, 185 and 186 thus provide capacitance between the secondary branch portions of signal conductor 156 and the three ground plane portions adjacent to each of junctions 156f, 156g and 156h. As was described with reference to amplifier 22 in FIG. 2, the capacitances and inductances are selected to provide impedance matching between an input circuit to which the amplifier is connected and the impedances of the FETS on chip 152.

FET chip 152 has a gate terminal at the end of each signal conductor 156 secondary branch portion. The set of gate terminals are represented generally by bumps 196. The source terminals are represented by bumps 198. Correspondingly, there is a drain terminal for each gate terminal, as represented by bumps 200. FIG. 5 shows output waveguides 202, 203, 204, 205, 206 and 207 extending from connection region 150, there being an output coplanar waveguide for each drain terminal. Again these output waveguides are transmission lines that provide impedance matching for the FETs on chip 152. The output signal paths may be joined after sufficient inductance is realized, or may diverge for subsequent individual signal processing according to the requirements of the specific application in which amplifier 140 is used.

The present invention thus provides for flip mounting of an integrated circuit on a coplanar waveguide. Ground conductors may be broad or strip in form. A single signal path in the waveguide may be divided into plural signal paths using coplanar waveguide transmission line structure, or conversely several signal paths may be combined into one. Manufacturing of the circuit is facilitated by having both ground and signal conductors on the same surface of a substrate, although intermediate connections between separated ground plane conductors is maintained through the use of noncoplanar techniques, such as air bridges, in order to cross over the signal conductors. Metalization on the opposite side of the substrate may also be used as well. Further, appropriate design of the split signal paths provides selected amounts of series inductance and shunt capacitance for impedance matching.

Capacitance and inductance are readily accommodated by coplanar design techniques, or may be augmented by a flip-chip mounted to the split coplanar waveguides. More generally, impedance matching may be provided by such techniques as substrate patterning, chip attachment, adding dielectric layers on conductors, and backside metalization. Similarly, flip mounting a transistor chip to the end of a coplanar waveguide provides ease of manufacture, consistent quality and improved performance characteristics. A power amplifier can thus be achieved by using a plurality of small amplifiers connected in parallel and impedance matched individually. Similarly, a push-pull power amplifier could be built according to the invention by using multiple push-pull lines.

It will be apparent to one skilled in the art that variations in form and detail may be made in the preferred embodiments without varying from the spirit and scope of the invention as defined in the claims and any modification of the claim language or meaning as provided under the doctrine of equivalents. For instance, the embodiments described provide different configurations for flip mounting a chip on a coplanar waveguide, and for splitting the signal path of a coplanar waveguide and achieving impedance matching through coplanar and flip-chip circuit components. The preferred embodiments are thus provided for purposes of explanation and illustration, but not limitation.

What is claimed is:

1. A coplanar waveguide-based circuit structure comprising:

an electrically insulating substrate having a planar face with a connection region;

a first coplanar waveguide mounted on said substrate face and having first and second, spaced-apart coplanar ground conductors, and a first signal conductor coplanar with said ground conductors and positioned between and spaced from said first and second ground conductors, said signal conductor and at least one of said first and second ground conductors extending into said connection region, said first and second ground conductors being integrally joined in said connection region; and an integrated circuit flip mounted on said connection region of said substrate with a first terminal flip mounted to said at least one ground conductor and a second terminal flip mounted to said signal conductor, said first coplanar waveguide conducting electrical current relative to said integrated circuit.

2. A circuit structure according to claim 1 wherein said signal conductor includes a base portion and at least first and second spaced-apart branch portions, at least one of said branch portions extending into said connection region for connection with said second terminal of said integrated circuit.

3. A circuit structure according to claim 2 wherein said first and second branch portions are integrally joined to said base portion, and said waveguide further comprises a third ground conductor coplanar with and electrically connected to said first and second ground conductors and extending between said first and second spaced-apart branch portions.

4. A circuit structure according to claim 3 wherein said branch portions and third ground conductor are all elongate and have generally uniform widths.

5. A circuit structure according to claim 2 wherein said signal conductor further comprises third and fourth branch portions extending into said connection region from said base portion and said integrated circuit further has third and fourth terminals flip mounted, respectively, to said third and fourth branch portions.

6. A circuit structure according to claim 1 further comprising a plurality of said coplanar waveguides extending in parallel with a single ground conductor extending between adjacent signal conductors, and wherein said integrated circuit further comprises a terminal corresponding to and flip mounted to each of said conductors.

7. A circuit structure according to claim 6 wherein said ground conductors are elongate and have generally uniform widths along at least a portion of their lengths.

8. A circuit structure according to claim 6 wherein said signal conductors and said ground conductors extending between adjacent signal conductors are elongate and have generally uniform and equal widths along at least a portion of their lengths.

9. A circuit structure according to claim 1 wherein said ground and signal conductors are elongate and have generally uniform widths along at least a portion of their lengths.

10. A circuit structure according to claim 1 further comprising capacitance means coupling adjacent sections of said signal conductor and at least one of said ground conductors.

11. A circuit structure according to claim 10 wherein said at least one ground conductor has a first section having a generally uniform spacing from said signal conductor, and said capacitance means comprises a second section of said at least one ground conductor having a reduced spacing from said signal conductor that is less than the generally uniform spacing.

12. A circuit structure according to claim 10 wherein said capacitance means comprises a second integrated circuit having at least one open-ended waveguide flip mounted to said signal conductor and to said at least one ground conductor.

13. A circuit structure according to claim 1 further comprising a second coplanar waveguide mounted on said substrate face spaced from and coplanar with said first coplanar waveguide, said second waveguide having third and fourth, spaced-apart coplanar ground conductors, and a second signal conductor coplanar with, positioned between, and spaced from said third and fourth ground conductors, said third and fourth ground conductors and said second signal conductor extending into said connection region for conducting electrical current relative to said integrated circuit, said first, second, third and fourth ground conductors being integrally joined in said connection region between said first and second signal conductors.

14. A coplanar waveguide-based circuit structure comprising:
an electrically insulating substrate having a planar face with a connection region;
a first coplanar waveguide mounted on said substrate face and having first and second, spaced-apart coplanar ground conductors, and a first signal conductor coplanar with said ground conductors and positioned between and spaced from said first and second ground conductors, said signal conductor including a base portion and at least first and second spaced-apart branch portions, at least one of said branch portions extending into said connection region from said base portion, at least one of said first and second ground conductors extending into said connection region;

a second coplanar waveguide mounted on said substrate face spaced from and coplanar with said first coplanar waveguide, said second waveguide having third and fourth, spaced-apart coplanar ground conductors, and a second signal conductor coplanar with, positioned between, and spaced from said third and fourth ground conductors, said third and fourth ground conductors and said second signal conductor extending into said connection region for conducting electrical current relative to said component, whereby said first, second, third and fourth ground conductors are integrally joined in said connection region between said branch portions and said second signal conductor; and an integrated circuit comprising first and second transistors flip mounted to said first, second, third and fourth ground conductors, to said first and second branch portions of said first signal conductor, and to said second signal conductor for receiving a signal input on said first signal conductor and for outputting a signal amplified by said transistors on said second signal conductor.

15. A circuit structure according to claim 14 further comprising at least a first capacitance means coupling said first and second branch portions to at least one adjacent ground conductor wherein said first and second branch portions form transmission lines having lengths that are appropriate, in combination with said at least a first capacitance means, for matching the input impedance of said waveguide to the input impedances of said first and second transistors.

16. A circuit structure according to claim 15 wherein there is a junction where said base portion is joined to said first and second branch portions, said first coplanar waveguide further comprising a third ground conductor coplanar with the electrically connected to said first and second ground conductors and extending between said first and second branch portions, said third ground conductor having an end adjacent to said junction, and said at least a first capacitance means is flip mounted to said end of said third ground conductor and to said junction.

17. A radio frequency circuit structure comprising:
an electrically insulating substrate having a planar face with a connection region;
a planar ground conductor mounted on said substrate planar face and extending across said connection region;
an input signal conductor mounted on said substrate planar face and having an input end and a plurality of output ends extending electrically in parallel into said connection region, said input signal conductor and ground conductor comprising, in combination, a first coplanar waveguide;
an output signal conductor also mounted on said substrate planar face electrically spaced from said input signal conductor, having an input end in said connection region and an output end spaced from said connection region, said output signal conductor and said ground conductor comprising, in combination, a second coplanar waveguide; and an integrated circuit chip flip mounted on said substrate and having a transistor associated with each input signal conductor output end, an input terminal for each transistor being connected to a corresponding one of said input signal conductor output ends and at least one output terminal connected to said input end of said output signal conductor for outputting the amplified signals from said transistors.

18. A circuit structure according to claim 17 further comprising one of said output signal conductors for each of said transistors, wherein each transistor has an output terminal connected to the associated one of said output signal conductors.

19. A high-frequency power amplifier comprising:

an electrically insulating substrate having a planar face with a connection region;

an integrated circuit chip flip mounted on said substrate connection region, having a plurality of transistors, and having a set of at least one control terminal connected to said transistors and a set of at least one output current terminal connected to said transistors, at least one of said sets having a plurality of associated terminals;

an impedance-matching network mounted on said substrate and associated with said one set of terminals and comprising a network coplanar waveguide having an elongate waveguide signal conductor for each terminal in said one set with a distal end spaced from connection region and a proximal end in said connection region and flip mounted to a respective one of said terminals in said one set, and a ground conductor on each side of said waveguide signal conductor, said network further comprising a capacitor coupling each of said waveguide signal conductor distal ends to an adjacent ground conductor, the length of said waveguide signal conductors and said capacitors providing a selected impedance at a selected frequency; and at least one separate signal conductor, separate from said waveguide signal conductors, mounted on said substrate and flip mounted to the other of said sets of terminals.

20. An amplifier according to claim 19 wherein all of said distal ends of said waveguide signal conductors are connected to a single base signal conductor.

21. An amplifier according to claim 19 wherein said capacitors are on a separate chip flip mounted to said waveguide signal and ground conductors.

22. An amplifier according to claim 21 wherein said capacitors comprise at least one coplanar waveguide with an open-ended signal conductor.

23. An amplifier according to claim 19 wherein said separate signal conductor is part of an associated coplanar waveguide having associated ground conductors connected to said ground conductors of said network coplanar waveguide.

24. A coplanar waveguide-based circuit structure comprising:

an electrically insulating substrate having a planar face with a connection region;

a first coplanar waveguide mounted on said substrate face and having first and second, spaced apart coplanar ground conductors, and a first signal conductor coplanar with said ground conductors and positioned therebetween wherein said first signal conductor is spaced a first distance from said first and second ground conductors proximate said connection region; and an integrated circuit flip mounted on said connection region of said substrate with a first terminal flip mounted to said first ground conductor and a second terminal flip mounted to said signal conductor so that said first coplanar waveguide conducts current relative to said integrated circuit, said signal conductor and said first ground conductor being spaced apart a second distance different from said first distance distal said connection region so as to provide impedance match to said integrated circuit.

* * * * *